United States Patent [19]
Engeler et al.

[11] 4,280,066
[45] Jul. 21, 1981

[54] CHARGE TRANSFER APPARATUS

[75] Inventors: William E. Engeler, Scotia; Jerome J. Tiemann, Schenectady, both of N.Y.

[73] Assignee: General Electric Company, Schenectady, N.Y.

[21] Appl. No.: 961,260

[22] Filed: Nov. 16, 1978

[51] Int. Cl.³ .................... G11C 19/28; H01L 29/78
[52] U.S. Cl. .................... 307/221 D; 357/24
[58] Field of Search .................... 357/24; 307/221 D

[56] References Cited

U.S. PATENT DOCUMENTS

| 4,058,003 | 11/1977 | Macovski | 73/626 |
| 4,152,678 | 5/1979 | Shott et al. | 307/221 D |

OTHER PUBLICATIONS

Beaver et al. "Ultrasonic Imaging, Using Two-Dimensional Transducer" Cardiovascular imaging and Image Processing, Theory and Practice 1975 vol. 72 Publ. Soc. Photo-Optical Instrumentation Engineers, Palo Verdes Estates, Calif.

Primary Examiner—Gene M. Munson
Attorney, Agent, or Firm—Julius J. Zaskalicky; James C. Davis, Jr.; Marvin Snyder

[57] ABSTRACT

A charge transfer device is described which includes a plurality of charge transfer channels or shift registers, each having at least two sections operable at two different clock frequencies to provide variable non-symmetrical time delays in the channels and which may be operated with another identical charge transfer device to provide the functional equivalence of a single charge transfer device having twice as many channels and providing symmetrical time delays in the channels.

1 Claim, 8 Drawing Figures

CHARGE TRANSFER APPARATUS

BACKGROUND OF THE INVENTION

This invention relates in general to charge transfer devices and in particular to such devices which include a plurality of charge transfer channels or shift registers on a common substrate for providing different time delays simultaneously variable to a plurality of sampled analog signals.

In certain applications such as in ultrasound imaging apparatus it is necessary to provide a plurality of different time delays to signals to enable coherent summation of the signals. In the case of the ultrasound imaging apparatus these signals are received from a transducer array. It is also necessary to simultaneously vary the time delays provided by the channels to each signal to effect a scanning of the field of view by the receiving beam of the transducer array. Each transducer of the array receives the ultrasound echo originating from an image point in the field of view at a slightly different time so that each channel or shift register requires a different compensation delay. The relationship of the required steering delays for the various shift registers is normally linear for steering the beam to an angle from the array normal. In this case, a linear variation of the delay of the various shift registers provides the proper delay for all the channels. Charge transfer channels or shift registers formed on a common substrate have been utilized for providing the various delay compensations required to effect the coherent summation. In particular, frequency dependent charge transfer devices which provide frequency dependent delays have been used. One form of such charge transfer device is shown and described in connection with FIG. 9 of an article entitled "Ultrasonic Imaging Using Two-Dimensional Transducer Arrays" by W. L. Beaver et al, appearing in "Cardio-Vascular Imaging and Image Processing," Theory and Practice, 1975, Volume 72, published by the Society of Photo-Optical Instrumentation Engineers, Palos Verdes Estates, Calif. In FIG. 9 of this article is shown a plurality of signal processing channels for processing echo signals from an array of ultrasonic transducers. Each of the channels includes a first and a second CCD delay line for steering. The first delay lines vary in length linearly from one side of the array to the other and the second delay lines also vary in length in a complementary fashion. A first clock provides voltages of first frequencies to the first delay lines and a second clock provides voltages of second frequencies to the second delay lines. The total number of stages in the first and second delay lines of each channel is the same. Thus, the relative delays of the channels and hence the angle of the receiving beam formed is dependent on the relative frequencies of the first and second clocks. If these frequencies are the same, the receiving beam would be directed along a normal to the array. When the frequency of the first clock is at one extreme value and the frequency of the second clock is at an opposite extreme value the receiving beam is directed along one extreme angle in respect to the normal of the array and vica versa. When a large number of channels or shift registers are required to be formed on a common substrate corresponding to the utilization of a large number of transducers in an array and hence the utilization of a large number of signal processing channels, a large number of CCD shift registers are required to be formed on a common substrate and also a large number of electrical contacts or terminals must be provided therefor. The fabrication of such devices or chips with high yield is difficult.

SUMMARY OF THE INVENTION

The present invention is directed to the reduction in complexity by a factor of at least two of the chip or substrate utilized for such purpose.

Another object of the present invention is to provide a pair of identical chips or substrate structures including the same number of identically formed channels which may be interconnected to provide the functional equivalent of a single substrate or chip having twice as many channels or shift registers of the character described above.

A further object of the present invention is to provide a system incorporating a pair of identical semiconductor chips each including the same number of channels or shift registers of the character described above in which clock pickup and clock feedthrough are substantially eliminated thereby improving the performance thereof over the performance of a single chip or substrate constituted of twice as many shift registers or channels.

In carrying out the invention in one illustrative embodiment thereof there is provided a plurality of shift registers for storage and delay of a plurality of sampled analog signals including n identical stages formed in parallel on a semiconductor substrate and consecutively numbered from 1 to N. Each stage includes a plurality of electrodes. Each shift register is divided into a first part and a second part with the first shift register including n stages in the first part and zero stages in the second part. The $N^{th}$ shift register includes n−m stages in the first part and m stages in the second part, where m is less than n-m. The number of stages included in the first parts of the shift registers between the first and the $N^{th}$ shift register varies linearly with shift register number from the first to the $N^{th}$ shift register. Thus, each successively numbered shift register has p stages more in the first part than the previously numbered shift register, where p is an integer. A first set of conductors is provided, each interconnecting respective electrodes of the stages of the first parts of the shift registers. A second set of conductors are also provided, each interconnecting respective electrodes of the stages of the second parts of the shift registers.

BRIEF DESCRIPTION OF THE DRAWINGS

The novel features which are believed to be characteristic of the present invention are set forth with particularity in the appended claims. The invention itself, both as to its organization and method of operation, together with further objects and advantages thereof, may best be understood by reference to the following description taken in connection with the accompanying drawings in which:

DESCRIPTION OF THE PREFERRED EMBODIMENTS

Figure 1:
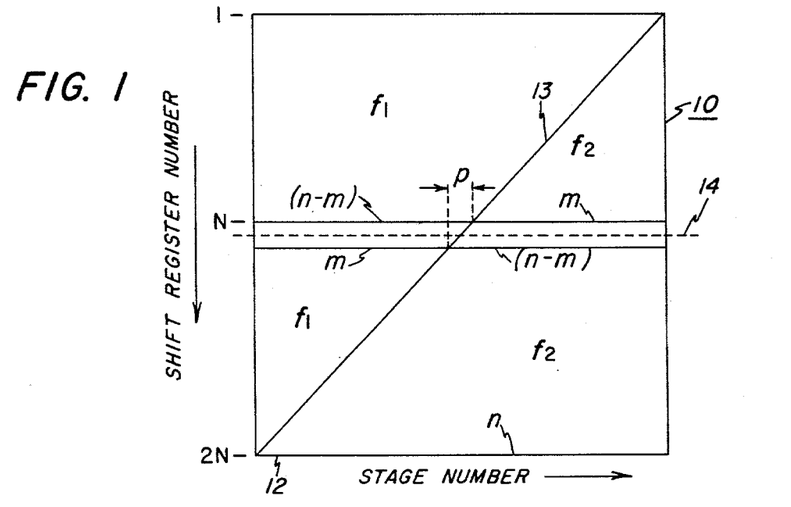
FIG. 1 is an outline diagram rectangular in form showing the location of a plurality of charge transfer shift registers on a single substrate or chip of semiconductor material to provide a plurality of time delays to signals applied thereto which are simultaneously variable as a function of variable frequencies $f_1$ and $f_2$ of clocking voltages applied respectively to a first and to a second part of each of the shift registers.

Reference is now made to FIG. 1 which shows an outline 10 rectangular in form representing the location of a plurality of charge transfer shift registers 2N in number on a single substrate of semiconductor material. The number of the shift register is indicated along the vertical right hand side of the rectangular outline. The number of stages in each of the shift registers, n in number, is indicated along the lower horizontal side of the rectangular outline. A diagonal line 13 is drawn from the upper right hand corner to the lower right hand corner of the rectangular outline 10 dividing each of the channels or shift registers into a first part to which clocking voltages of frequency $f_1$ are applied and a second part to which clocking voltages of frequency $f_2$ are applied. The first shift register includes n stages in the first part and zero stages in the second part. The $N^{th}$ shift register includes m stages in the second part and (n−m) stages in the first part, where m is less than (n−m). The number of stages included in the second parts of the shift registers between the first and the $N^{th}$ shift register vary linearly as indicated by the straight line 13 with shift register number from the first to the $N^{th}$ shift register with each successively numbered shift register having p stages more than the previously numbered shift register, where p is an integer. The number of stages included in the second part of the $(N+1)^{th}$ shift register is obtained by adding the quantity p added to the quantity m, representing the number of stages in the second part of the $n^{th}$ shift register. The number of stages included in the second part of the $(N+1)^{th}$ shift register is also equal to (n−m). Thus, $$m+p=n-m,$$

or $$m=(n-p)/2 \qquad (1)$$

Thus, if p=2, N=27 and n=106, m would equal 52 and n−m would equal 54. Accordingly, with a total of 54 shift registers, each shift register including 106 stages an increase of 2 stages in the second parts of successive shift registers would provide a linear variation of numbers of stages in the second parts with shift register number. If p is an odd number then n must also be an odd number so that m may take on integer values. In some situations a two phase clocking arrangement may be employed where m may have one-half integer values. Similarly higher phase clocking permits smaller fractional values for m. In general the allowed values for m are in steps of the reciprocal of the number of clock phases employed. The number of stages n is adjusted so that the allowed values of m may be obtained in accordance with equation 1. Thus, in a one phase system even values of n are used for even values of p and odd values of n are used for odd values of p.

Figure 2:
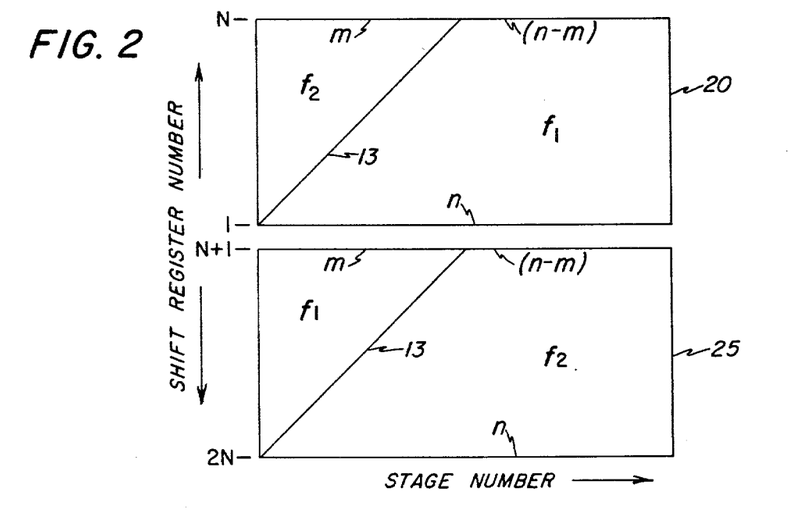
FIG. 2 shows a pair of identical outline diagrams rectangular in form representing the location of a plurality of charge transfer shift registers on a single substrate each including the same number of shift registers and the same proportioning of each of the shift registers into a first and a second part. The upper outline diagram is equivalent functionally to the portion of the outline diagram of FIG. 1 including shift registers 1 through N with the second parts of the shift registers which are operated at clock frequency $f_2$ arranged to the left of the first parts thereof which are operated at clock frequency $f_1$, and also with shift register No. 1 appearing at the bottom of the rectangular outline whereas in FIG. 1 it appears at the top. The lower outline diagram is equivalent functionally to the lower half of the diagram of FIG. 1.

In accordance with the present invention the functionally equivalent result obtained with the formation of the shift registers 2N in number on a single chip or substrate, as shown in FIG. 1 may be obtained by the provision of two identical chips 20 and 25 of FIG. 2, each including one-half the number of shift registers. Each of the chips would be identical in structure to the lower half of the chip outline of FIG. 1 appearing below the dividing line 14 of FIG. 1. Shift register N+1 is located at the top of the chip outline 25 and shift register 2N is located at the bottom of the chip outline 25. The first parts of the shift registers of outline 25 would be located on the left hand side and the second parts would be located on the right hand side of the outline 25, identical to the arrangement in the lower half of the outline 10 of FIG. 1. To function shift register organization of outline 20 of FIG. 2 to provide the equivalent result provided by the upper half of the shift register organization of outline 10 of FIG. 1, shift register No. 1 would be located along the bottom of the outline 20 and shift register No. N would be located along the top of the outline 20. The stages of the shift registers to the left of the line 13 would now be second parts of the shift registers and would be energized with clocking voltages of frequency $f_2$. The stages of the shift registers to the right of line 13 would be the first parts and would be energized with clocking voltages of frequency $f_1$. Thus, by reversing the designation of channel numbers or shift register numbers and by reversing the clocking voltages applied to the first and second parts of the shift registers, the function performed by the upper half of the shift registers of the organization of outline 10 of FIG. 1 may be obtained by using the same shift register organization that is used for the lower half of the outline 10. One mode of implementation of the substrates 20 and 25 of FIG. 2 will be illustrated and described in connection with FIGS. 3 and 4. The manner in which the two substrates are connected to a pair of clocking voltages and the manner of applying analog signal samples thereto will be described in connection with the block diagram of FIG. 6, which also illustrates the manner in which improved performance can be obtained as well.

Figure 3:
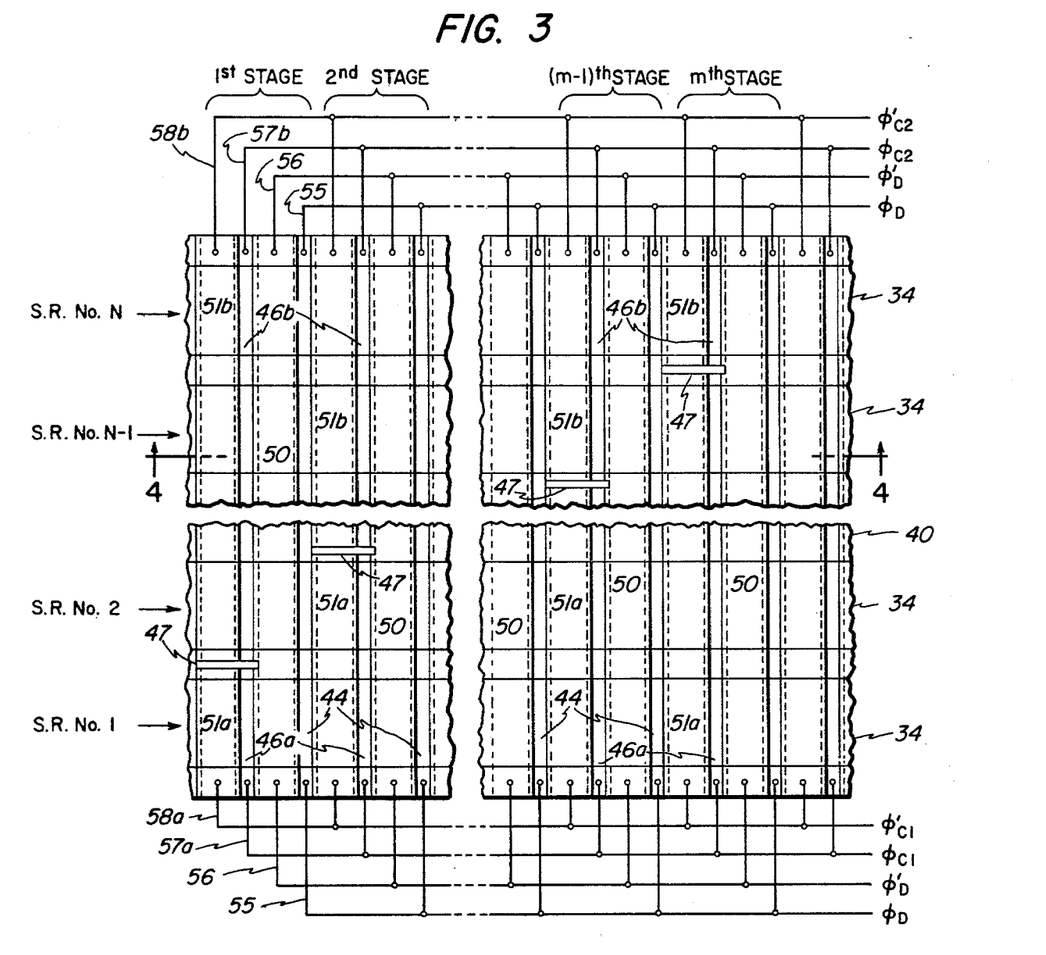
FIG. 3 is a plan view of an implementation of the organization of charge transfer shift registers shown in each of the outline diagrams of FIG. 2.
Figure 4:
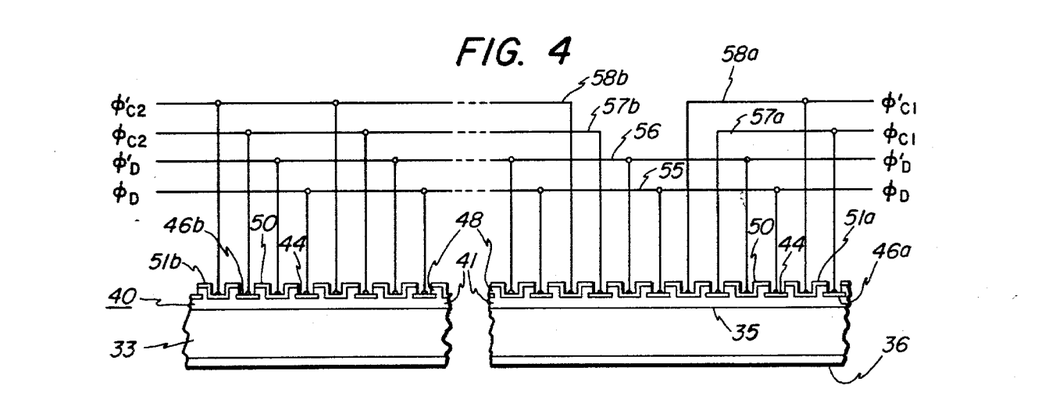
FIG. 4 is a sectional view of the charge transfer device of FIG. 3 taken along the section line 4—4 of FIG. 3.

Reference is now made of FIGS. 3 and 4 which show one mode of implementing the organization of charge transfer shift registers described in connection with diagrams 20 and 25 of FIG. 2. The diagram of FIG. 3 is broken through a central horizontal portion thereof to show only the organization of shift registers No. 1 and 2 along the bottom portion of the diagram and shift registers (N−1) and N along the top portion of the diagram for reasons of simplicity in illustrating and describing the structure and operation thereof. Also, the diagram is broken along a central vertical portion thereof to show only several stages of the shift registers. The shift registers are formed on a semiconductor substrate 33 of N-type conductivity which has a plurality of channel portions 34 of uniform width and adjacent a major surface 35 of the substrate. Each of the channel portions 34 extend in a horizontal direction along the substrate. Typically, the substrate 33 may be silicon semiconductor material of 4 ohm centimeter resistivity. Overlying the major surface 35 of the substrate 33 is a thick insulating member 40 having a plurality of thin portions 41 each of which is of generally rectangular outline and each lies in registry with a respective one of the channel portions 34 of the substrate. A first plurality of electrodes 44 are provided on the insulating member 40 overlying the thin portion 41 thereof of shift registers 1 through N and orthogonal to the lengths thereof. Each of the electrodes 44 is of uniform length in the direction of the length of the semiconductor channel portions 34 and each of the electrodes extends across the thin insulating portions 41 and the bordering thick insulation portions of the insulating member 40 of the shift registers. A second plurality of electrodes 46a are provided on the insulating member 40 overlying the thin portion 41 associated with shift register No. 1 and orthogonal to the length thereof, and also overlying the thin portion associated with stages 2 through n of the second shift register and so on. Each of the electrodes 46a is of uniform length in the direction of the length of the channel portions 41 and equal to the uniform length of each of the electrodes 44 of the first plurality. Each of the electrodes 46a of the second plurality are spaced between adjacent electrodes of the first plurality and each extends completely over the thin insulating portions 41 of the first shift register as well as the bordering thick insulation portions thereof as indicated. A third plurality of electrodes 46b are provided on the insulating member 40 overlying the thin portion 41 associated with stages 1 through m of shift register No. N and orthogonal to the length thereof, and also overlying the thin portion associated with stages 1 through m-1 of the shift register (N-1) and so on. Each of the electrodes 46b is of uniform length in the direction of the length of the channel portions 41 and equal to the uniform length of each of the electrodes 44 of the first plurality. Each of the electrodes 46b of the third plurality are spaced between adjacent electrodes of the first plurality and each extends completely over the thin insulating portions 41 of the shift registers as well as the bordering thick insulation portions thereof as indicated. Corresponding electrodes 46a and 46b of corresponding stages form corresponding gaps 47 overlying the bordering thick insulating portions between thin channel portions 41, as shown. Thus, a first gap 47 appears on the part of thick insulating ridge between the first stages of the first and second shift registers and a second gap 47 appears on the part of the third insulating ridge between the second stages of the second and third shift registers and so on. The last gap 47 appears on the part of the thick insulating ridge between the $m^{th}$ stages of $N^{th}$ shift register and the $(N-1)^{th}$ shift register. An insulating layer 48 is provided over the electrodes 44, 46a and 46b of the first, second and third pluralities. Preferably, the first, second and third pluralities of electrodes 44, 46a and 46b are constituted of doped polycrystalline silicon. This material may be readily oxidized into a silicon dioxide composition which provides the insulating layer 48 over these electrodes.

A first plurality of transfer electrodes 50 are provided over the insulating layer 48 and exposed portions of the thin portion 41. Each of the transfer electrodes 50 is insulatingly spaced between and insulatingly overlies respective adjacent storage electrodes 46a and 44 of the first and second pluralities of storage electrodes and also adjacent storage electrodes 46b and 44 of the first and third pluralities. Each of the transfer electrodes 50 is of substantially uniform extent in the direction of the length of the channel portions 41 and extends entirely over the thin insulating portions 41 of the shift registers 1 through N thereof as well as the bordering thick insulating portions thereof. A second plurality of transfer electrodes 51a are provided over the insulating layer 48 and exposed portions of the thin portion 41. Each of the transfer electrodes 51a is insulatingly spaced between and insulatingly overlies respective adjacent storage electrodes 46a and 44 of the first and second pluralities of storage electrodes. Each of the transfer elements 51a is of substantially uniform extent in the direction of the length of the channel portions 41 and extends entirely over the thin insulating portions 41 of the shift registers as well as the bordering thick insulating portions thereof. A third plurality of transfer electrodes 51b are provided over the insulating layer 48 and exposed portions of the thin portion 41. Each of the transfer electrodes 51b is insulatingly spaced between and insulatingly overlies respective adjacent storage electrodes 46b and 44 of the first and third pluralities. Each of the transfer electrodes 51b is of substantially uniform extent in the direction of the length of the channel portions 41 and extends entirely over the thin insulating portions 41 of the shift registers as well as the bordering thick insulating portions thereof. The first, second and third pluralities of transfer electrodes may be constituted of the same material as the first, second and third pluralities of storage electrodes, that is, polycrystalline silicon suitably doped to increase the conductivity thereof. Prior to the deposition of the transfer electrodes the surface of the semiconductor substrate underlying the exposed part of the thin portion 21 is increased in conductivity by more heavily doping the surface regions with impurities, for example, by ion implantation for increasing the threshold voltage for inversion of the semiconductor surface below the transfer electrodes. Thus, with the same voltage level applied to the transfer electrodes 50 as is applied to the electrodes of the first and second pluralities, the surface potential in the substrate underlying the transfer electrodes would be greater, that is, less inverted than the surface potential underlying the electrodes of the first and second pluralities. Accordingly, a reduced number of voltages applied to the electrodes are required for functioning of the apparatus, as will be more fully described below. Conductive layer 36, constituted of a suitable material such as gold, is bonded to the lower surface of the substrate 33 to provide an ohmic contact therewith.

Figure 5:
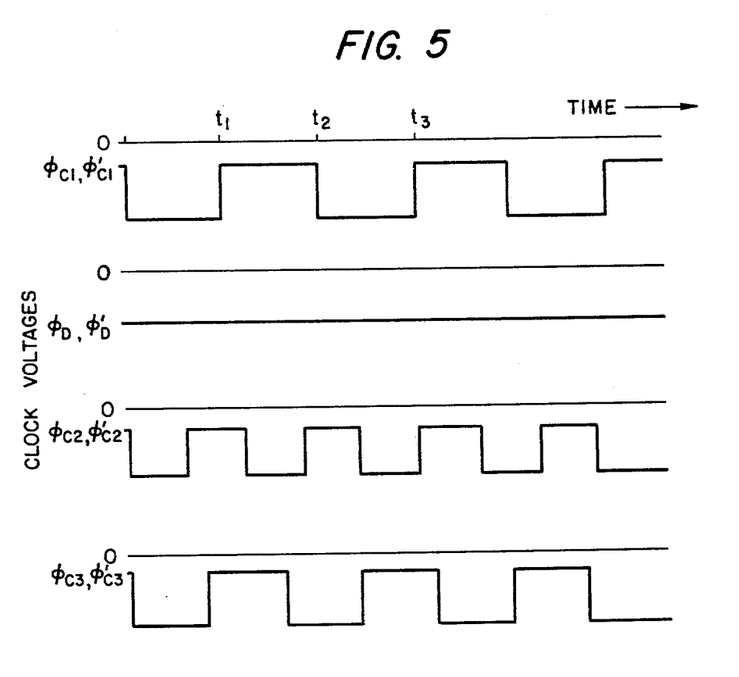
FIG. 5 is a diagram of voltage waveforms useful in describing the operation of the charge transfer devices of FIGS. 3 and 4.

All of the storage electrodes 44 of the first plurality are connected to a common line 55 to which a $\phi_D$ voltage is applied. All of the storage electrodes 46a of the second plurality are connected to a common line 57a to which a voltage $\phi_{C1}$ is applied. All of the storage electrodes 46b of the third plurality are connected to a common line 57b to which a voltage $\phi_{C2}$ is applied. All of the transfer electrodes 50 of the first plurality are connected to a common line 56 to which a $\phi_d'$ voltage is applied. All of the transfer electrodes of the second plurality 51a are connected to a common line 58a to which a $\phi_{C1}'$ voltage is applied. The voltages $\phi_D$, $\phi_{C1}$, $\phi_D'$, $\phi_{C1}'$ applied to the aforementioned lines are shown in FIG. 5. The voltages $\phi_D$ and $\phi_D'$ are DC voltages and the voltages $\phi_{C1}$ and $\phi_{C1}'$ are clocking voltages of frequency $f_1$. All of the transfer electrodes 46b of the third plurality are connected to a common line 58b to which a voltage $\phi_{C2}'$ is applied. The voltage $\phi_{C2}$ and $\phi_{C2}'$ are clocking voltages of frequency $f_2$ and are shown in FIG. 5. Thus, the device described in connection with FIGS. 3 and 4 is a plurality of shift registers numbered 1 through N in which all of the stages of the first shift register are clocked at a frequency $f_1$ determined by the frequency of the clocking voltages $\phi_{C1}$ and $\phi_{C1}'$. The second shift register includes a first stage which is clocked at a frequency determined by the frequency $f_2$ of the clocking volages $\phi_{C2}$ and $\phi_{C2}'$ and the remaining stages thereof are clocked at the frequency $f_1$ of the clocking voltages $\phi_{C1}$ and $\phi_{C1}'$. Each of the successively numbered shift registers successively includes an additional stage that is clocked by the clocking voltage of frequency $f_2$ until shift register No. N is reached. In shift register No. N, stages 1 through m are clocked at frequency $f_2$ and stages m+1 through stage m are clocked at frequency $f_1$.

The manner in which packets of charge are transferred from stage to stage in shift register No. 1 of FIGS. 3 and 4 will now be described in connection with the waveform diagrams of FIG. 5. Each stage of shift register No. 1 includes a $\phi_{C1}'$ electrode 51a, a $\phi_{C1}$ electrode 46a, a $\phi_D'$ electrode 50 and a $\phi_D$ electrode 44 recited in sequence in order in the direction of charge transfer in the shift register. To these electrodes are connected, respectively, the voltages $\phi_{C1}'$, $\phi_{C1}$, $\phi_D'$ and $\phi_D$ shown in FIG. 5. The pulse voltages $\phi_{C1}$ and $\phi_{C1}'$ are identical and are supplied from a single terminal. The $\phi_C$ and $\phi_C'$ voltages are alternating and vary between a low potential level 42 and a high potential level 43 in respect to minority charge carries in the substrate 33. When these voltages are applied to the $\phi_{C1}$ and the $\phi_{C1}'$ electrodes they produce surface potentials which vary between a low surface potential level to a high surface potential level for minority carries in the substrate. As the threshold voltage of the $\phi_{C1}'$ electrodes is higher than the threshold level of the $\phi_{C1}$ electrodes, the surface potentials appearing under the $\phi_{C1}'$ electrodes are higher than the corresponding surface potentials appearing under the $\phi_{C1}$ electrodes for the same level of voltage applied thereto. The fixed voltages $\phi_D$ and $\phi_D'$, which are conveniently shown as identical, produce surface potential in the substrate underlying the $\phi_D$ and the $\phi_D'$ electrodes which are different in view of the fact that the threshold voltages of these electrodes are different. The threshold voltage of the $\phi_D'$ electrodes is greater than the threshold voltage of the $\phi_D$ electrodes. Accordingly, the surface potential on the substrate underlying the $\phi_D'$ electrode is higher than the surface potential in the substrate underlying the $\phi_D$ electrode for minority carriers for the same level of applied voltage. The $\phi_D$ voltage is set to have a level lying between the lower level 42 and upper level 43 of the $\phi_{C1}$ voltage. The $\phi_D'$ voltage is also set to lie between the lower and upper levels of the $\phi_{C1}$ voltage. At time $t_1$, the $\phi_{C1}$ and the $\phi_{C1}'$ voltages rise from the low level 42 to the high level 43 thereby providing surface potentials underlying the $\phi_{Cl}$ and the $\phi_C'$ electrodes which are higher than the surface potential of the regions underlying the $\phi_D$ and the $\phi_D'$ electrodes. As the surface potential underlying the $\phi_{C1}'$ electrodes are always greater than the surface potential underlying the $\phi_{C1}$ electrodes, charge in the $\phi_{C1}$ storage region is inhibited from flowing in the direction of the region underlying the $\phi_{C1}'$ electrodes and flows instead from left to right from the $\phi_{C1}$ storage regions through the region underlying the $\phi_D'$ region into the storage region underlying the $\phi_D$ electrode. Thus, as potential of the storage regions underlying the $\phi_D$ electrodes are now lower than the potentials of the storage regions underlying the $\phi_{C1}$ electrodes, charge can flow from the $\phi_{C1}$ electrodes over the potential barrier underlying the $\phi_D'$ electrodes into the $\phi_D$ storage regions. At time $t_2$ both the $\phi_{C1}$ and $\phi_{C1}'$ voltage drop from the upper level 43 to the lower level 42 thereof setting the surface potentials in the surface regions underlying the $\phi_{C1}$ electrodes at a valve below the surface potential underlying the $\phi_D$ electrodes. Thus, during the time intervals $t_2$ to $t_3$ charge from the storage regions underlying the $\phi_D$ electrodes flows into the storage regions underlying the $\phi_C$ electrodes, thereby completing a cycle of charge transfer in the shift registers. in subsequent clocking cycles the charge transfer cycle is repeated to cause charge to be clocked from left to right in the shift register.

In each of the shift registers other than shift register No. 1 charge is transferred in one part of the shift register at one frequency $f_1$ and in the other part of the shift register at the other frequency $f_2$. The situation of a storage cell comprising a $\phi_D'$ electrode 50 and a $\phi_D$ electrode 44 between electrodes $\phi_{C1}$ and $\phi_{C1}'$ clocked at frequency $f_1$ and $\phi_{C2}$ and $\phi_{C2}'$ electrodes clocked at frequency $f_2$ eliminates charge build up due to the relative phasing of the clocking voltages of different frequencies. Such structure is described and claimed in patent application Ser. No. 961,258, filed concurrently herewith and assigned to the assignee of the present invention.

Figure 6:
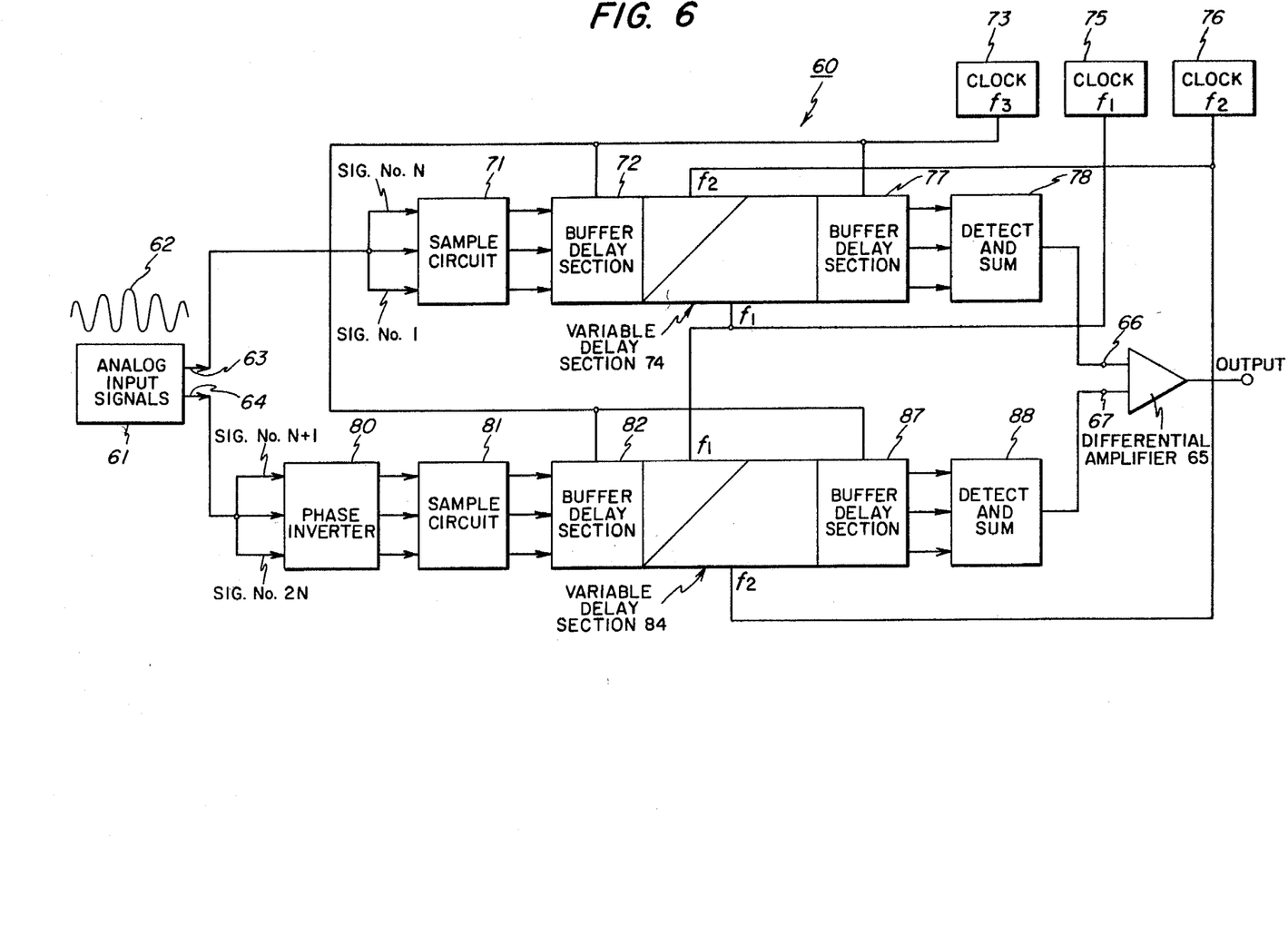
FIG. 6 is a block diagram incorporating a pair of charge transfer devices such as shown in FIGS. 2, 3 and 4 to provide a device which is functionally equivalent to a charge transfer device including twice as many channels, and also in which clock voltages and clock voltage couple through voltages are cancelled to improve the operation of the resultant system.

Reference is now made to FIG. 6 which shows a system 60 incorporating a pair of chips, each including a plurality of charge transfer shift registers, such as described in connection with outline diagrams 20 and 25 of FIG. 2, to provide the functional equivalence of a single chip including the same number of charge transfer shift registers as is included on the pair of chips, such as described in connection with outline 10 of FIG. 1. The system of FIG. 6 also provides improved performance in the operation of the charge transfer shift registers in that clock voltages are substantially eliminated in the output of the system. The system shown in FIG. 6 is useful in ultrasound imaging systems in which signals from the transducers of a receiving array are delayed and thereafter coherently summed to provide a resultant signal representing the reflections from an object in the field of the array of transducers. One such system is described and claimed in patent application Ser. No. 908,908, filed May 24, 1978, assigned to the assignee of the present invention, now U.S. Pat. No. 4,155,260. The system 60 includes a source 61 of a plurality of independent input signals, such as signals from the transducer of an ultrasonic receiving array. One such signal is shown in waveform 62 consisting of several oscillations at the resonant frequency of the transducers of the transmitting array of the ultrasonic imaging system. The frequency of such a signal may typically be 2.5 megahertz. The signals from the source 61 are divided into a first plurality of signals designated Signal No. 1 through Signal No. N, represented by arrow 63, and a second plurality of signals designated Signal No. N+1 through Signal No. 2N and represented by arrow 64. The first plurality of signals are processed in the upper portion or branch of the system to delay, detect and coherently sum the signals. The second plurality of signals are processed in the lower portion or branch of the system, wherein each of the signals is inverted, and thereafter delayed, detected and coherently summed. The coherently summed signal provided by the upper branch of the system is applied to the inverting 66 terminal of a differential amplifier 65, and the coherently summed signal provided by the lower branch of the system is applied to the non-inverting terminal 67 of the differential amplifier 65. As the second plurality of signals are inverted, or shifted 180 degrees in phase, the differential amplifier, in producing an output representing the difference of the coherent sum of the first plurality of signals and the coherent sum of the second plurality of signals, provides an output representing the coherent sum of both first and second plurality of signals. However, as the clocking voltages utilized in each of the branches of the systems are in phase any clock voltage and clock voltage feed-through to the detect and sum means in the upper and lower branches is cancelled by the differential amplifier 65 thereby providing an output relatively free of clock voltage and clock voltage feed-through, as will be more clearly understood from a more detailed description of the system of FIG. 6.

Figure 7:
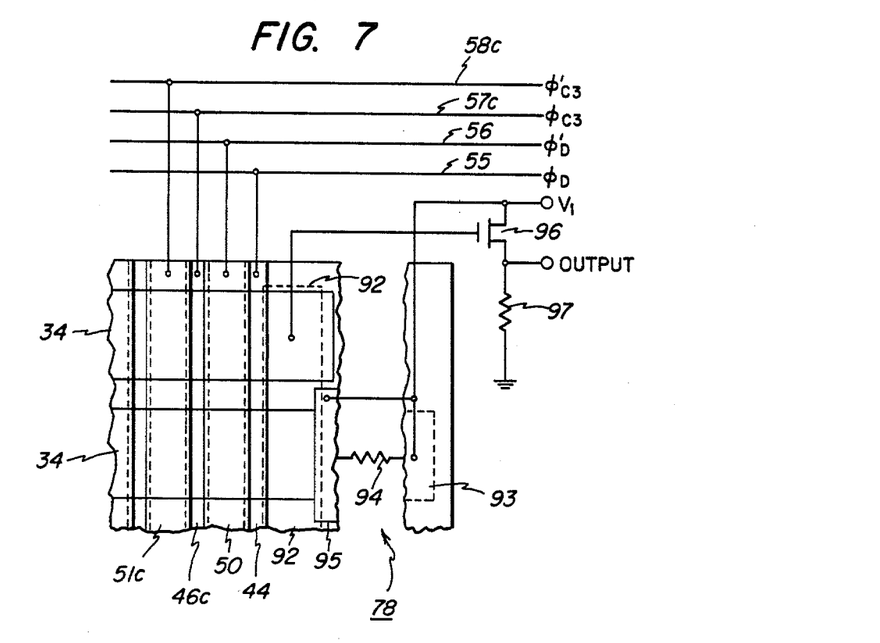
FIG. 7 is a plan view of one mode of detecting the charge samples of the delayed analog signals at the output of the apparatus of FIG. 6 and summing such detected outputs.
Figure 8:
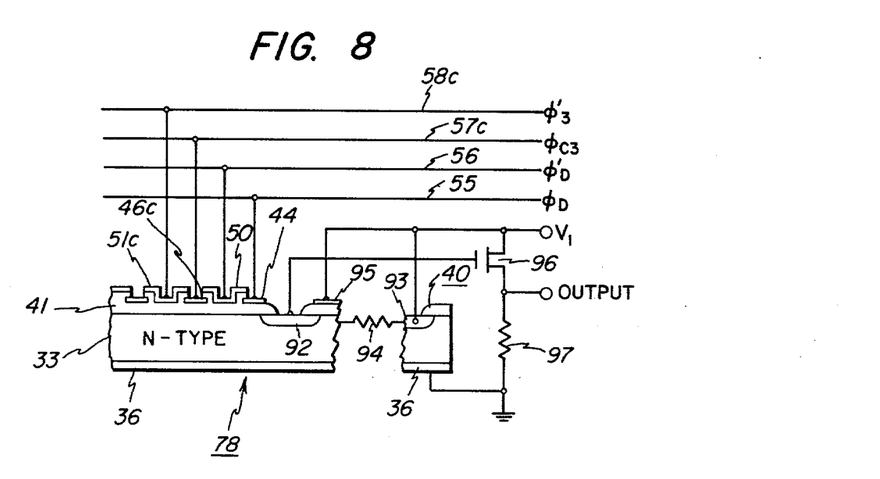
FIG. 8 is a sectional view of the apparatus of FIG. 7 taken along section lines 8—8 of FIG. 7.

The upper branch of the system 60 includes a first sampling circuit 71 including N channels and a buffer delay section 72 including the same number of channels for receiving the outputs from the first sampling circuit 71. The sampling Circuit 71 and the buffered delay section are operated at the same fixed frequency $f_3$ by clocking voltages, such as $\phi_{C3}$ and $\phi_{C3}'$ shown in FIG. 5, from a clocking voltage generator or clock 73. Each of the channels of the sampling circuit function to convert the signal applied thereto into packets of charge. The sampling circuit 71 and the buffered delay section 72 are operated at a frequency at least twice the highest frequency of the applied signal and conveniently for a signal 62 of the nominal frequency of 2.5 megahertz, the sampling circuit and the buffered delay section could be operated at a frequency of 15 megahertz. One such sampling circuit is described and claimed in copending patent application Ser. No. 934,012, filed Aug. 16, 1978, assigned to the assignee of the present invention, now U.S. Pat. No. 4,165,537. The packets of charge appearing in each of the channels of the buffer delay section 72 are transferred or coupled into corresponding channels of the variable delay section 74, which comprises a first plurality of shift registers including n identical stages formed in parallel on a substrate and consecutively numbered from 1 to N as shown in connection with outline drawing 25 of FIG. 2 and also shown in greater detail in connection with FIGS. 3 and 4. As pointed out in connection with FIG. 2, the first shift register includes n stages in the first part and zero stages in the second part and the $N^{th}$ shift register includes m stages in the second part and n-m stages in the first part, where m is less than n-m. The number of stages included in the second parts of the shift registers between the first and the $N^{th}$ shift register vary linearly with shift register number from the first to the $N^{th}$ shift register with each successively numbered shift register having a fixed number of stages more than the previously numbered stage. A clock voltage of variable frequency $f_1$ from source 75 and clock voltage of variable frequency $f_2$ from source 76 are applied to the first and second parts respectively of the variable delay section 74. To provide a steering function for the receiving beam of an ultrasonic imaging system such as mentioned above the clocking frequencies $f_1$ and $f_2$ would be varied from below to above the buffer frequency $f_3$, for example, between 5 megahertz and 30 megahertz. The samples appearing at the output of the variable delay section 74 are applied to the buffer delay section 77 clocked at the same frequency $f_3$ as the input buffer delay section 72. The buffer delay section 72 and 77 each consist of several stages which are operated at fixed clock frequency $f_3$ and function to enable voltage signals, to be converted into charge samples and back into voltage signals which are independent of the variable frequencies $f_1$ and $f_2$ of clocks 75 and 76. The series of packets of charge from the output of each of the channels of the buffer delay section 77 are detected and summed in the detect and sum circuit 78. The detect and sum circuit may take various forms, one form of which is shown in FIGS. 7 and 8 and will be described in connection therewith. The output of the detect and sum circuit 78 is applied to the inverting terminal 66 of the differential amplifier 65.

The lower branch of the system 60 to which the second plurality of input signals designated signal No. N+1 to signal No. 2N are applied includes an inverter 80 for inverting each of the signals applied thereto, a sampling circuit 81 to which the outputs of the phase inverter 80 are applied, a buffer delay section 82, a variable delay section 84, a output buffer delay section 87 and a detect and sum circuit 88. Circuits 81, 82, 84, 87, and 88 are identical in constitution to the corresponding circuits in the upper branch including respectively, sampling circuit 71, buffer delay section 72, variable delay section 74, buffer delay section 77 and detect and sum circuit 78. However, the order of application of the second plurality 64 of signals to the channels in the lower branch is reversed from the order of application of the first plurality 63 of signals in the channels in the upper branch. Signal No. N+1 is applied to the uppermost channel of the circuits including the uppermost shift register of the variable delay section 84 and successively higher numbered signals are applied to successively lower situated channels with signal No. 2N applied to the lowermost channel of the circuits. Clock voltages of frequency $f_3$ are applied to the second sampling circuit 81, the input buffer delay section 82 and the output buffer delay section 87. The clocking voltages of frequency $f_1$ are applied to the second parts of the shift registers of variable delay section 84 and clocking voltages of frequency $f_2$ are applied to the first parts of the shift registers of the variable delay section 84. The output from the detect and sum circuit 88 is applied to the non-inverting terminal 67 of the differential amplifier 65. Thus, at the output of differential amplifier 65 a coherent summation is obtained of the input signals from source 61. This coherent summation is obtained by the use of charge transfer delay lines on variable delay sections 74 and 84 which are varied in electrical length by varying the frequencies applied to two parts thereof. The organization of the system into two branches, each processing one-half of the signals, enables utilization of charge transfer devices in a way in which common mode signals such as clock voltages and clock voltage feed through signals are substantially cancelled, thereby enhancing the operation of the system.

Reference is made to FIGS. 7 and 8 which shows a circuit for sensing or detecting the outputs of the channels of each of the variable delay sections 74 and 84 of FIG. 6 and deriving a respective sum signal. In this figure only two channels are shown for reason of simplicity and may correspond to channel N and channel N−1 of FIGS. 3 and 4 and of course would be formed on the same substrate 33 as the variable delay section. One stage of the buffer charge transfer section 77 which is clocked by identical voltage $\phi_{C3}'$ and $\phi_{C3}$ of frequency $f_3$ is shown. The elements of FIGS. 7 and 8 identical to elements of FIGS. 3 and 4 are identically designated.

The portion of the detect and sum circuit shown in FIGS. 7 and 8 comprises a substrate of N-type conductivity with channel portions 34 for shift registers No. N and No. N−1. The electrodes overlying the thin insulating portions 41 of the $N^{th}$ and the $(N-1)^{th}$ signal processing channels constitute the last stage of the output buffer section 78 of the system. Each stage of the buffer section is structurally identical to the other stages of the shift registers and including electrodes 51c, 46c, 50 and 44 corresponding to electrodes 51a, 46a, 50 and 44 of stage of the shift register No. 1. Clocking voltages $\phi_{C3}$ and $\phi_{C3}'$ of frequency $f_3$, shown in FIG. 5, are applied to electrodes 46c and 51c, respectively, over lines 57c and 58c, respectively for clocking charge therealong at a frequency $f_3$. A region 92 of P-type conductivity is provided at the right hand end of all of the channel portions 34 and functions as one connection to impedance 94. The P-type region 92 extends across the entire substrate into each of the channel portions 34 of the plurality of shift registers located on the substrate 33. The $\phi_D$ electrodes 44 of the last stage of the buffer section 78 of the signal processing channels partially overlaps the P-region 92. Another region 93 of P-type conductivity is spaced apart from the P-type region 92, preferably centrally located on the substrate 33, to constitute the second terminal of impedance 94. Impedance 94 may, for example, consist of a field effect transistor or it may consist of a serpentine P-type region of suitable conductivity. In the case where impedance 94 is constituted of a field effect transistor, P-type region 92 forms the source of the transistor, while region 93 forms its drain. A gate electrode 95 is provided insulatingly overlying the part of the channel portion included between the source and drain regions of the transistor. The gate electrode 95 and the drain 93 is connected to a voltage $V_1$ which preferably lies below the surface potential of the empty storage region underlying the $\phi_D$ storage electrode 44 of the buffer stage. The charge samples flowing into the P-region 92 from all of the signal processing channels produce a voltage thereon corresponding to the sum of the samples. Current flows from region 92 through channel resistance of the transistor to ground. Thus, not only are the charge samples summed on P-region 92, but the capacitance of P-region 92 and the channel resistance of transistor provide a low pass filter which provides a degree of low pass filtering.

The change in voltage on the P-region 92 is applied to a gate of transistor 96 connected as a source follower in which the source is connected through a source resistance 97 to ground. A voltage proportional to the sum of the charges delivered to the P-region 92 appears across the source resistance 97 and is applied to the differential amplifier 65 of FIG. 6. Maintaining $V_1$ below the surface potential of empty storage region underlying the $\phi_D$ electrode 44 of the buffer stage reduces the contribution of that electrode to the total capacitance of the low pass filter, and therefore improves the level of signal output and dynamic range of the device. Source follower transistor 96 further assures that the capacitance of the low pass filter is maintained at a low level.

While the invention has been described in specific embodiments, it will be understood that modifications, such as those described above, may be made by those skilled in the art, and it is intended by the appended claims to cover all such modifications and changes as fall within the true spirit and scope of the invention.

What is claimed is:

1. In combination,
a first plurality of N charge transfer shift registers,
said first plurality of shift registers formed in parallel on a first substrate and consecutively numbered from 1 to N, each shift register including n identical stages, each stage including a plurality of electrodes, said n identical stages of each shift register divided into a first part and a second part, the first shift register including n stages in the first part and zero stages in the second part, the number of stages included in the second parts of said shift registers between said first and said $N^{th}$ shift register varying linearly with shift register number from said first to said $N^{th}$ shift register with each successively numbered shift register having p stages more than the previously numbered shift register, the $N^{th}$ shift register including m stages in the second part and n−m stages in the first part where m is p stages less than n−m, whereby the number n of stages in each shift register equals (2N−1) p,
a first set of conductors, each interconnecting respective electrodes of the stages of the first parts of said first plurality of shift registers,
a second set of conductors, each interconnecting respective electrodes of the stages of the second parts of said first plurality of shift registers,
a second plurality of N charge transfer shift registers,
said second plurality of shift registers formed in parallel on a second substrate and consecutively numbered from 2N to N+1, each shift register including n identical stages, each stage including a plurality of electrodes, said n identical stages of each shift register divided into a first part and a second part, the $2N^{th}$ shift register including n stages in the first part and zero stages in the second part, the number of stages included in the second parts of said shift registers between said $2N^{th}$ and said $(N+1)^{th}$ shift register varying linearly with shift register number from said $2N^{th}$ to said $(N+1)^{th}$ shift register with successively numbered shift registers having p stages more than the previously numbered shift register, the $(N+1)^{th}$ shift register including m stages in the second part and n−m stages in the first part where m is p stages less than n−m, whereby the number n of stages in each shift register equals (2N−1) p, each of said first set of conductors interconnecting respective electrodes of the stages of the second parts of said second plurality of shift registers, each of said second set of conductors interconnecting respectively electrodes of the stages of the first parts of said second plurality of shift registers, means for providing 2N analog signals consecutively numbered from 1 to 2N, signals 1 to N constituting a first plurality of analog signals and signals 2N to N+1 constituting a second plurality of signals, means for inverting each of the signals of said second plurality of signals, means for introducing a first plurality of series of packets of charge into said first plurality of shift registers, each series representing successive samples of a respective one of said first plurality of analog signals, means for introducing a second plurality of series of packets of charge into said second plurality of shift registers, each series representing successive samples of a respective one of said inverted signals of second plurality of analog signals, means for applying a first set of clocking voltages of a first frequency to said first set of conductors and for applying a second set of clocking voltages of a second frequency to said second set of conductors, means for detecting and summing the outputs of said first plurality of shift registers to obtain a first sum output, means for detecting and summing the outputs of said second plurality of shift registers to obtain a second sum output, and means for obtaining an output representing the difference of said first sum output and said second sum output.

* * * * *